(12) United States Patent
Sundström et al.

(10) Patent No.: US 8,279,971 B2
(45) Date of Patent: Oct. 2, 2012

(54) DETERMINING A LEVEL OF POWER REDUCTION FOR A TRANSMITTER

(75) Inventors: Lars Sundström, Lund (SE); Torgny Palenius, Barsebäck (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 670 days.

(21) Appl. No.: 12/521,056

(22) PCT Filed: Dec. 19, 2007

(86) PCT No.: PCT/EP2007/011142
§ 371 (c)(1),
(2), (4) Date: Jul. 1, 2009

(87) PCT Pub. No.: WO2008/077540
PCT Pub. Date: Jul. 3, 2008

(65) Prior Publication Data
US 2010/0296605 A1    Nov. 25, 2010

(30) Foreign Application Priority Data
Dec. 27, 2006 (EP) .................................. 06388073

(51) Int. Cl.
*H04K 1/02* (2006.01)
*H04L 25/03* (2006.01)
*H04L 25/49* (2006.01)

(52) U.S. Cl. ....................................................... 375/296

(58) Field of Classification Search .................. 375/148, 375/150, 219, 221, 222, 257, 259, 260, 284, 375/290, 295, 296, 297, 327; 455/114.2, 455/115.1, 125, 126, 127.1, 422.1, 452.2, 455/522

See application file for complete search history.

(56) References Cited

U.S. PATENT DOCUMENTS

| | | | |
|---|---|---|---|
| 6,233,436 B1 * | 5/2001 | Dent | 455/114.2 |
| 2003/0223507 A1 * | 12/2003 | De Gaudenzi et al. | 375/279 |
| 2004/0037363 A1 * | 2/2004 | Norsworthy et al. | 375/259 |
| 2005/0130610 A1 * | 6/2005 | Scheck et al. | 455/126 |
| 2005/0180527 A1 * | 8/2005 | Suzuki et al. | 375/297 |
| 2006/0068830 A1 * | 3/2006 | Klomsdorf et al. | 455/522 |
| 2006/0178121 A1 * | 8/2006 | Hamalainen et al. | 455/125 |
| 2007/0184790 A1 * | 8/2007 | Gilberton et al. | 455/127.1 |

* cited by examiner

Primary Examiner — David C. Payne
Assistant Examiner — Syed Haider

(57) ABSTRACT

A level of power reduction for a transmitter arranged to transmit signals modulated according to one of a number of modulation configurations via radio channels in a digital wireless communications system is estimated. Modulation dependent data comprising a term calculated from a third order product of a signal modulated according to a modulation configuration are provided, and a power reduction estimate for transmission of signals modulated according to said modulation configuration is calculated there from. The modulation dependent data are provided to comprise, in addition to the term calculated from a third order product, at least one term calculated from a higher order product. Further, transmitter dependent data are provided, and the estimate is calculated from said modulation dependent and transmitter dependent data. Thus a more accurate method of determining a power reduction is achieved, which also allows different operating conditions for the transmitter to be considered.

19 Claims, 10 Drawing Sheets

DETERMINING A LEVEL OF POWER REDUCTION FOR A TRANSMITTER

TECHNICAL FIELD OF THE INVENTION

The invention relates to determining a level of power reduction for a transmitter for signals being modulated according to one of a number of modulation configurations via a number of radio channels in a digital wireless communications system.

DESCRIPTION OF RELATED ART

In the 3GPP ($3^{rd}$ Generation Partnership Project) standard for radio communication between e.g. a mobile terminal and a base station information is transmitted or carried over a number of physical channels. Examples of physical channels are the Dedicated Physical Data Channel (DPDCH) and the Dedicated Physical Control Channel (DPCCH). One radio link or radio channel between a mobile terminal and a base station typically includes several physical channels. Radio channels to be used by individual mobile terminals are typically separated by e.g. 5 MHz or, in other words, the spacing between adjacent radio channels is typically 5 MHz.

Spreading is applied to the physical channels. It consists of two operations. The first is the channelization operation, which transforms every data symbol into a number of chips, thus increasing the bandwidth of the signal. The number of chips per data symbol is called the Spreading Factor. The second operation is the scrambling operation, where a scrambling code is applied to the spread signal. With the channelization, data symbols on so-called I- and Q-branches are independently multiplied with an Orthogonal Variable Spreading Factor (OVSF) code. With the scrambling operation, the resultant signals on the I- and Q-branches are further multiplied by complex-valued scrambling code, where I and Q denote real and imaginary parts, respectively. The spreading operation includes a spreading stage, a weighting stage, and an IQ mapping stage. In the process, the streams of real-valued chips on the I and Q branches are summed; this results in a complex-valued stream of chips for each set of channels, which is then scrambled by the complex-valued scrambling code. The physical channels are defined in the technical specification 3GPP TS 25.211 V6.2.0 (2004-09), while the technical specification 3GPP TS 25.213 V6.4.0 (2005-09) specifies how they are combined into one single complex-valued (I,Q) baseband signal through the use of spreading, weighting and scrambling.

In the 3GPP there is a mode referred to as High Speed Uplink Packet Access (HSUPA). The specification for this mode allows more than 300 000 different configurations of signal modulation to be used by the transmitter of the mobile terminal or user equipment (UE). A corresponding mode is referred to as High Speed Downlink Packet Access (HSDPA).

Each of these many modulation configurations will have its own unique properties, e.g. with respect to peak-to-average (PAR) statistics. Typically, a higher peak-to-average ratio results in increasing requirements on linearity of the radio transmitter and in particular a more linear power amplifier (PA) at high output power. This means that if the RMS level of signals is kept constant, different configurations will, due to their different peak-to-average levels, result in different levels of distortion and thus different levels of Adjacent Channel Leakage power Ratio (ACLR) when the signals are fed to a nonlinear circuit, such as a radio frequency (RF) power amplifier in a transmitter. ACLR is defined as the ratio of a filtered mean power centered on the assigned channel frequency to a filtered mean power centered on an adjacent channel frequency.

To alleviate this issue the output power of the power amplifier may be reduced from the nominal maximum output power to a lower value in dependence of the modulation configuration used. The lower maximum output power leads to a lower distortion for a given configuration with the aim to approximately equalize the ACLR performance for all configurations. This power reduction is also referred to as back-off. The 3GPP standard includes in the technical specification 3GPP TS 25.101 V7.5.0 (2006-10) a maximum allowed level of the power reduction, defined as Maximum Power Reduction (MPR), which is based on a cubic metric calculated as the RMS value of the third order product of the normalized voltage waveform of the input signal (calculated in dB) for the modulation configuration in question.

The maximum back-off is changed quite often, e.g. every time the constellation with the number of simultaneous physical channels and the power and/or channelization code and/or scrambling code of any physical channel is changed. For Wideband Code Division Multiple Access (WCDMA) this can be as often as every slot based on HSDPA and HSUPA channel scheduling.

For an actual implementation with specific transmitter components (assumed to include the radio frequency (RF) power amplifier) the Maximum Power Reduction as specified in the 3GPP standard is a poor estimate of the back-off that is really needed to achieve the specified ACLR for a given modulation configuration. This leads to unnecessarily degraded performance of the user equipment with respect to coverage and throughput. Further, the power reduction required to achieve a certain level of ACLR depends on the specific transmitter implementation and its operating conditions.

Thus there is a need for a solution that can calculate the required back-off for a specific transmitter setup with improved accuracy, and which possibly also has the ability to allow back-off to vary with operating conditions such as temperature, load, ageing etc.

A similar problem arises already at the design phase of a transmitter chain. Regardless whether operating conditions should be considered or not, there is a need to verify that a given transmitter chain will fulfil ACLR specifications with predefined back-off levels for all modulation configurations. Or the other way around, it may be wanted to find the required back-off levels to reach a certain level of ACLR. This is a huge and impractical task if all 300 000 configurations should be simulated or measured. Furthermore, if a large set of operating conditions should be verified as well the task would become impossible. Also in this situation the accuracy of the known methods is insufficient.

Therefore, it is an object of the invention to provide a method of determining a level of power reduction or back-off for a transmitter more accurately than with the method specified in the 3GPP standard, and which allows different operating conditions for the transmitter to be considered. Further, it should be possible to implement the method in a mobile terminal as well as during the design phase of such a mobile terminal.

SUMMARY

According to the invention the object is achieved in a method of determining a level of power reduction for a transmitter arranged to transmit signals via a number of radio channels in a digital wireless communications system, each of said signals being modulated according to one of a number of modulation configurations, the method comprising the steps of providing data dependent on a property of a modulation configuration, said modulation dependent data comprising a term calculated from a third order product of a signal modulated according to said modulation configuration; and calculating from said modulation dependent data an estimate for a power reduction to be used for transmission from said transmitter of signals modulated according to said modulation configuration. The method further comprises the steps of providing the modulation dependent data so that said modulation dependent data in addition to said term calculated from a third order product comprise at least one term calculated from a higher order product of the signal modulated according to said modulation configuration; providing data dependent on a property for said transmitter; and calculating said estimate for a power reduction from said modulation dependent data and said transmitter dependent data.

The use of terms calculated from higher order products in addition to the term calculated from the third order product gives an improved accuracy of the power reduction estimate. Providing separately modulation dependent data and transmitter dependent data and then calculating the power reduction estimate by combining them ensure that different operation conditions for the transmitter can much more easily be taken into consideration, since the modulation dependent data need only to be calculated once, and the results can then be reused for all operating conditions.

In one embodiment the terms calculated from the products are calculated from an RMS value of each of the third and higher order products.

The accuracy of the power reduction estimate can be further improved when the terms are calculated from an RMS value of each of the third and higher order products within at least one measurement channel. The terms can then be calculated by generating for each modulation configuration a waveform based on random input data; calculating for each generated waveform waveforms of third and higher order products of the generated waveform; filtering the calculated waveforms with measurement filters for at least one adjacent channel; and calculating RMS values of the filtered waveforms. In addition to filters for adjacent channels, the calculated waveforms may also be filtered with a measurement filter for the assigned radio channel (in-band), and an RMS value for this filtered waveform may be used as well in the calculation of the power reduction estimate.

Further, the terms calculated from the products may be calculated from third, fifth and seventh order products. This provides a good compromise between high accuracy and low complexity of the calculations.

In one embodiment the transmitter dependent data comprise a number of coefficients determined from at least one of simulations and measurements for a limited set of modulation configurations using least-mean-square fitting. Using simulations or measurements for a limited number of modulation configurations in determining the transmitter coefficients ensures that the computational resources needed are kept within limits without compromising the accuracy. The coefficients may be determined by finding the lowest and the highest value for each of a number of said terms calculated from the third and higher order products; defining the eight combinations of these lowest and highest values as vectors; identifying modulation configurations having terms closest to each of said defined vectors; and using the terms of the identified modulation configurations in said at least one of simulations and measurements. The coefficients may be determined for different operating conditions for the transmitter.

In one embodiment the step of calculating a power reduction estimate is performed in a mobile terminal comprising said transmitter. In this way the power reduction required for a given modulation configuration can be calculated in the mobile station during use when that modulation configuration is to be used.

Alternatively, the step of calculating a power reduction estimate is performed during a design phase of said transmitter. In this way the method can be used for verifying that a given transmitter fulfils the ACLR requirements.

As mentioned, the invention also relates to a mobile terminal comprising a transmitter arranged to transmit signals via a number of radio channels in a digital wireless communications system, each of said signals being modulated according to one of a number of modulation configurations, the mobile terminal comprising means for providing an estimate for a power reduction to be used for transmission from said transmitter of signals modulated according to said modulation configuration, wherein said estimate is calculated from data dependent on a property of a modulation configuration, said modulation dependent data comprising a term calculated from a third order product of a signal modulated according to said modulation configuration. Further, the modulation dependent data comprise, in addition to said term calculated from a third order product, at least one term calculated from a higher order product of a signal modulated according to said modulation configuration; and said estimate is calculated from said modulation dependent data and data dependent on a property for said transmitter.

In one embodiment the terms calculated from the products are calculated from an RMS value of each of the third and higher order products.

The accuracy of the power reduction estimate can be further improved when the terms are calculated from an RMS value of each of the third and higher order products within at least one measurement channel.

Further, the terms calculated from the products may be calculated from third, fifth and seventh order products. This provides a good compromise between high accuracy and low complexity of the calculations.

In one embodiment the transmitter dependent data comprise a number of coefficients determined from at least one of simulations and measurements for a limited set of modulation configurations using least-mean-square fitting. Using simulations or measurements for a limited number of modulation configurations in determining the transmitter coefficients ensures that the computational resources needed are kept within limits without compromising the accuracy. The coefficients may be or have been determined for different operating conditions for said transmitter.

In one embodiment of the mobile terminal the means for providing said estimate for a power reduction comprises a look-up table in which power reduction estimates calculated in advance for each modulation configuration are stored. This embodiment is useful when different operating conditions are not to be considered. When a given modulation configuration is to be used, the corresponding level of power reduction can be taken from the look-up table.

In another embodiment the mobile terminal may comprise means for providing said data dependent on a property of a modulation configuration, said modulation dependent data comprising terms calculated from a third order product and at least one higher order product of a signal modulated according to said modulation configuration; means for providing said data dependent on a property for said transmitter; and means for calculating from said modulation dependent data and said transmitter dependent data the estimate for a power reduction to be used for transmission from said transmitter of signals modulated according to said modulation configuration. This embodiment is useful when different operating conditions have to be considered in the mobile terminal. This allows the power reduction to be calculated in the mobile terminal in dependence of its current operating conditions. In this case, the means for providing said modulation dependent data may comprise a look-up table in which terms calculated in advance for each modulation configuration are stored, and the means for providing said transmitter dependent data may comprise a look-up table in which data calculated in advance for the transmitter are stored. This simplifies the calculations in the mobile terminal.

The invention also relates to a computer program and a computer readable medium with program code means for performing the method described above.

BRIEF DESCRIPTION OF THE DRAWINGS

The invention will now be described more fully below with reference to the drawings, in which.

DETAILED DESCRIPTION OF EMBODIMENTS

Figure 1:
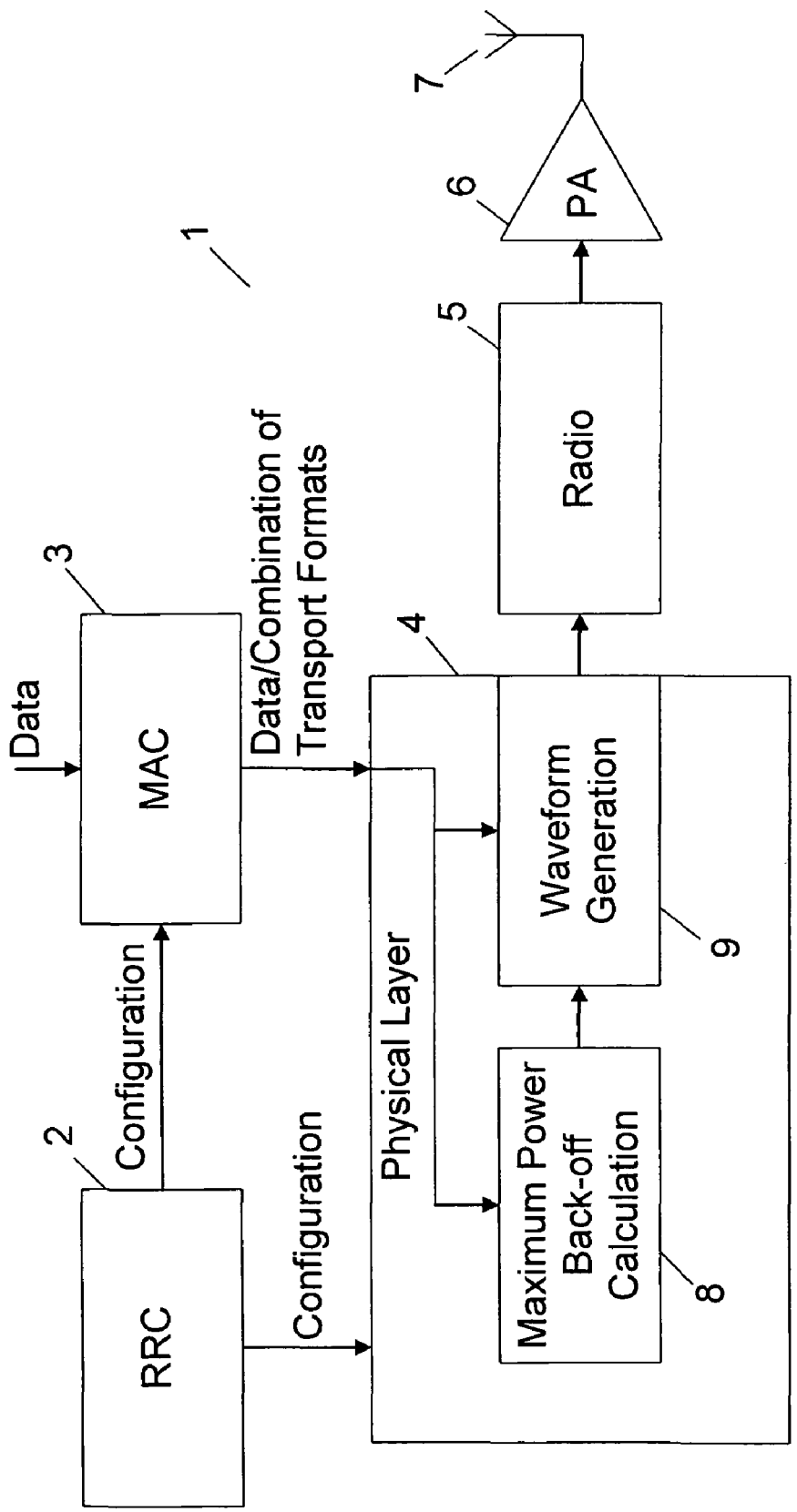
FIG. 1 shows a block diagram of a transmitter in a mobile terminal.

In FIG. 1 a simple block diagram of a transmitting chain 1 in a mobile terminal is shown. The mobile terminal may be adapted for use in e.g. a Code Division Multiple Access (CDMA) system or a Wideband Code Division Multiple Access (WCDMA) system according to the 3GPP standard and arranged to handle the modes High Speed Uplink Packet Access (HSUPA) and High Speed Downlink Packet Access (HSDPA). The specification for the HSUPA mode allows more than 300 000 different configurations of signal modulation to be used by the transmitter of the mobile terminal.

Five blocks are shown, radio resource control RRC 2, medium access control MAC 3, physical layer 4, Radio 5 and the Power Amplifier PA 6. In the RRC block 2, channels are configured based on control messages from the network. In this configuration of channels all possible transport format combinations are given as well as the configuration of HSDPA and HSUPA. The MAC block 3 is handling the data which are to be transmitted on each of the channels. MAC schedules the amount of data which shall be transmitted on each of the channels. In the physical layer 4 the multiplexing of data on the physical channels is performed, the channels are modulated and combined in the waveform generator 9. The resulting signals are then handled by the radio circuit 5 and amplified in the power amplifier 6 for transmission via the antenna 7.

As mentioned, the transmitter 1 of the mobile terminal may be required to handle more than 300 000 different configurations of signal modulation, each of which has its own unique properties, e.g. with respect to the peak-to-average ratio of the signal. If the root-mean-square (RMS) level of signals is kept constant, signals with different peak-to-average ratio will cause different levels of distortion in a nonlinear circuit, such as the power amplifier 6. Since such distortion affects leakage to adjacent channels, also the Adjacent Channel Leakage power Ratio (ACLR), defined as the ratio of a filtered mean power centered on the assigned channel frequency to a filtered mean power centered on an adjacent channel frequency, will be different for each modulation configuration.

To reduce the consequences of this effect, the output power of the power amplifier 6 may be reduced from the nominal maximum output power to a lower value in dependence of the modulation configuration used with the aim of approximately equalizing the ACLR for all modulation configurations. This power reduction is also referred to as back-off. The 3GPP standard includes a maximum allowed level of the power reduction, i.e. a Maximum Power Reduction (MPR).

The power reduction or back-off can be calculated in the Maximum Power Back-off Calculation unit 8 based on the input from RRC 2 and MAC 3, and this limits the maximum output power transmitted from the terminal. The calculated back-off is used in the waveform generation 9 when transmitting the signal.

In the technical specification 3GPP TS 25.101 V7.5.0 (2006-10) the Maximum Power Reduction (MPR) is based on a cubic metric (CM) calculated as the RMS value of the third order product of the normalized voltage waveform of the input signal (calculated in dB) for the modulation configuration in question. More specifically, the cubic metric is based on the UE (user equipment) transmit channel configuration and is given by:

$$CM = CEIL\{[20*\log_{10}((v\_norm^3)_{rms}) - 20*\log_{10}((v\_norm\_ref^3)_{rms})]/k, 0.5\}$$

where

CEIL $\{x, 0.5\}$ means rounding upwards to closest 0.5 dB, i.e. CM$\in$[0, 0.5, 1.0, 1.5, 2.0, 2.5, 3.0, 3.5], k is 1.85 or 1.56 depending on the channelisations code of the signal, v_norm is the normalized voltage waveform of the input signal, v_norm_ref is the normalized voltage waveform of a reference signal (12.2 kbps AMR Speech), and $$20*\log_{10}((v\_norm\_ref^3)_{rms}) = 1.52 \text{ dB}.$$

More generally, the cubic metric (CM) may be defined by:

$$CM = 20 \cdot \log_{10}(rms(|s_1|^3)),$$

where $s_1$ is a signal (e.g. based on random input data) modulated according to a given modulation configuration. In other words, the cubic metric is the RMS value of the third order product of the complex signal envelope in dB. A unity (normalized) RMS input signal may be assumed.

The power reduction or back-off relative to a reference case can then be estimated according to:

$$BO_c = b_3 \cdot (CM_c - CM_0).$$

Here the subscript "c" denotes a specific modulation configuration. The required back-off (BO) for a given modulation configuration with cubic metric $CM_c$ is calculated relative to a reference modulation configuration with cubic metric $CM_0$. The coefficient $b_3$ corresponds to $1/k$ in the above equation.

Instead of a constant, the coefficient $b_3$ may be unique for each transmitter configuration but independent of the modulation. This coefficient can in principle be found by means of simulations and/or measurements where the required back-off to reach a certain ACLR is found. Here, a number of configurations are used, carefully selected to have large difference in cubic metric. From these simulations and/or measurements the coefficient $b_3$ may be determined using least-mean-squared (LMS) fitting of the data.

The back-off calculated from this formula has proven to be a poor estimate of the back-off that is actually needed to achieve approximately the same ACLR for all modulation configurations. Although the formula indicates that the properties of the modulation configuration and the properties of the transmitter can be separated or decoupled in that the cubic metric, which depends on the modulation configuration but not on the transmitter and its operating conditions (such as temperature, load, ageing etc.), and the coefficient $b_3$, which depends on the transmitter and its operating conditions but should be independent of the modulation, can be calculated separately/independently and then combined to get the estimate of the back-off required for a given modulation configuration and a given transmitter (and given operating conditions), in practice the poor accuracy of the formula makes it difficult or even impossible to calculate in the transmitter a correct coefficient $b_3$ that can actually be used for all modulation configurations for a given transmitter and given operating conditions.

The problem also arises already at the design phase of a transmitter chain. Regardless whether operating conditions should be considered or not, there is a need to verify that a given transmitter chain will fulfil ACLR specifications with predefined back-off levels for all modulation configurations. Or, the other way around, it may be wanted to find the required back-off levels to reach a certain level of ACLR. This is a huge and impractical task if all 300 000 configurations should be simulated or measured. Furthermore, if a large set of operating conditions should be verified as well, the task would become impossible.

In the following an improved method of estimating the required back-off for a given modulation configuration and a given transmitter is described.

First, however, it is noted that in the above calculations the RMS value of the third order product of the normalized voltage waveform of the input signal (calculated in dB) for the modulation configuration in question was calculated. This third order product of the input signal is commonly used together with higher order products in modelling of nonlinear radio frequency circuits.

If a complex-valued baseband input signal is defined by $s_1 = I_1 + jQ_1$, the products of this signal are defined by:

$$s_n = |s_1|^{n-1} s_1,$$

where "n" is an odd number (3, 5, 7 . . . ) and usually no higher than 9. A nonlinear circuit can be modelled as a polynomial $$s_0 = c_1 s_1 + c_3 |s_1|^2 s_1 + c_5 |s_1|^4 s_1 + c_7 |s_1|^6 s_1,$$

where $s_0$ is the output signal, and the order has been limited to seven for the sake of clarity. However, the order may easily be extended to higher orders if required. The coefficients $c_n$ may in the general case be arbitrary complex numbers. The small signal gain is defined by $c_1$ and the others are weighting factors for products of various orders. The higher order factors, i.e. $c_3$, $c_5$ and $c_7$, increase with increasing distortion of the nonlinear circuit. The above equation is a time domain representation where the input signal is added to weighted products of various orders. The terms in the frequency domain corresponding to $s_1$ and $s_n$ are denoted by $S_1(f)$ for the modulated input signal and $s_n(f)$ for the product n. Thus the frequency domain representation corresponding to the above polynomial may be written as $$S_o(f) = c_1 S_1(f) + c_3 S_3(f) + c_5 S_5(f) + c_7 S_7(f).$$

While the back-off calculation mentioned above was based on a cubic metric, the improved method also introduces metrics for higher order products according to:

$$XM_n = 20 \cdot \log_{10}(\mathrm{rms}(|s_1|^n)),$$

where "n" is an odd number (3, 5, 7 . . . ) and usually no higher than 9. This means that e.g.

$$XM_3 = CM = 20 \cdot \log_{10}(\mathrm{rms}(|s_1|^3)),$$

$$XM_5 = 20 \cdot \log_{10}(\mathrm{rms}(|s_1|^5)),$$

$$XM_7 = 20 \cdot \log_{10}(\mathrm{rms}(|s_1|^7)),$$

These metrics are referred to as eXtended order Metrics. The back-off can then be calculated as a linear combination of these metrics:

$$BO_c = \sum_{n \in N} b_n \cdot (XM_{c,n} - XM_{0,n}),$$

where "N" denotes the product order set over which the back-off is calculated, and the subscript "c" as above denotes a specific modulation configuration. Again, the required back-off for a given modulation configuration with extended order metric $XM_{c,n}$ is calculated relative to a reference modulation configuration with extended order metric $XM_{0,n}$. If the order is again limited to seven for the sake of clarity, the back-off is:

$$\begin{aligned} BO_c &= b_3 \cdot (XM_{c,3} - XM_{0,3}) + b_5 \cdot (XM_{c,5} - XM_{0,5}) + \\ &\quad b_7 \cdot (XM_{c,7} - XM_{0,7}) \\ &= b_3 \cdot (CM_c - CM_0) + b_5 \cdot (XM_{c,5} - XM_{0,5}) + \\ &\quad b_7 \cdot (XM_{c,7} - XM_{0,7}). \end{aligned}$$

The coefficients $b_n$ can be determined using regular least-mean-squared (LMS) fitting of the data as discussed above.

Thus in addition to the cubic metric, this method also includes metrics for higher order products. It is noted that some of the coefficients $b_n$ can be negative, and thus the back-off calculated by this method is not necessarily larger than the one based on the cubic metric only. Instead the calculated back-off is more accurate, since also the higher order products are taken into consideration. As shown below, the back-off levels calculated in this way actually do provide a better equalization of the ACLR. The better accuracy also makes it easier to determine the coefficients $b_n$ from simulations and/or measurements for a limited number of modulation configurations.

In the method just described the accuracy of the estimated back-off levels was improved by considering in addition to the RMS values of the third order product of a given modulated signal (i.e. a given modulation configuration) the RMS values of higher order products. The method may be further improved by specifying the RMS values for a given modulated signal and its products over a predefined set of measurement channels. Thus instead of using, in the calculation of the back-off levels, the RMS values of the products over the full frequency range, the RMS values of the products within the predefined set of measurement channels may be used.

As the purpose of the invention is to calculate the back-off to keep a constant ACLR for all modulation configurations, the set of measurement channels may, as an example, be constituted by the measurement channels as defined in the 3GPP standard for ACLR measurements, basically an SQRC (SQuare-root Raised Cosine) filter with roll-off factor $\alpha=0.22$ and bandwidth of 3.84 MHz with an offset of 0, 5, and 10 MHz for the in-band, first adjacent, and second adjacent channel, respectively. The transfer function for the measurement channel is denoted by $H_m(f)$, where m denotes the channel position, i.e. m=0 corresponds to the in-band channel (zero offset), m=1 corresponds to the first adjacent channel (5 MHz offset) and finally m=2 corresponds to the second adjacent channel (10 MHz offset). In the general case the offset could take both positive and negative values. For simplicity it is here assumed that the spectra of the signal and its products are symmetric and thus the sign of the offset is arbitrary.

The RMS values for a given modulation configuration specified over the predefined set of measurement channels constitute a set of RMS level terms, which can be denoted with $A_{n,m}$ where each term specifies an RMS value for the product n (1 for the input signal and 3, 5, 7, etc. for respective product) within the measurement channel m (0 for carrier or in-band channel and 1 and 2 for respective adjacent channel). These terms constitute a set of numbers, which can also be called a profile, that is unique for each modulation configuration. Thus the word "modulation profile" may be used for this set.

Each term specifying an RMS value for the product n within the measurement channel m is given by $$A_{n,m} = \sqrt{\int_{-\infty}^{+\infty} |S_n(f) \cdot H_m(f)|^2 df}.$$

Figure 2:
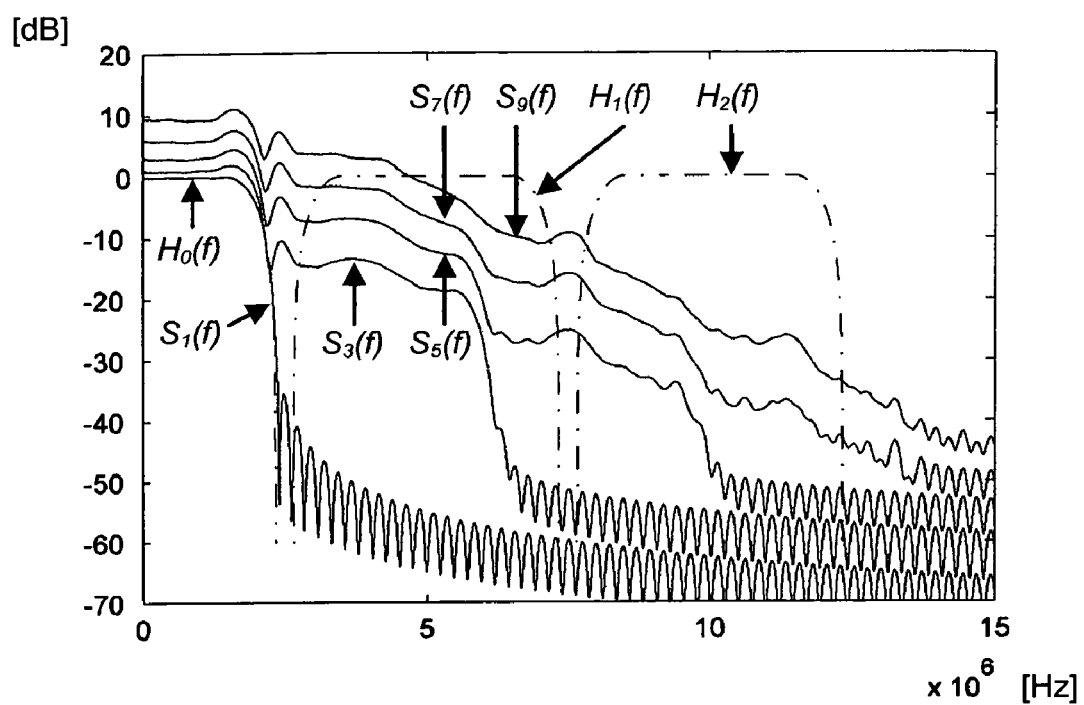
FIG. 2 shows the spectra of an example of a modulated signal and its products in the frequency domain together with the transfer functions for measurement channels.

FIG. 2 illustrates these quantities. Here the spectra of an example of a modulated signal (a 12.2 kbs Reference Measurement Channel (RMC) signal as defined in 3GPP TS 25.101) and its products are shown in the frequency domain together with the transfer functions for the measurement channels 1 and 2 to the right of the signal.

Figure 3:
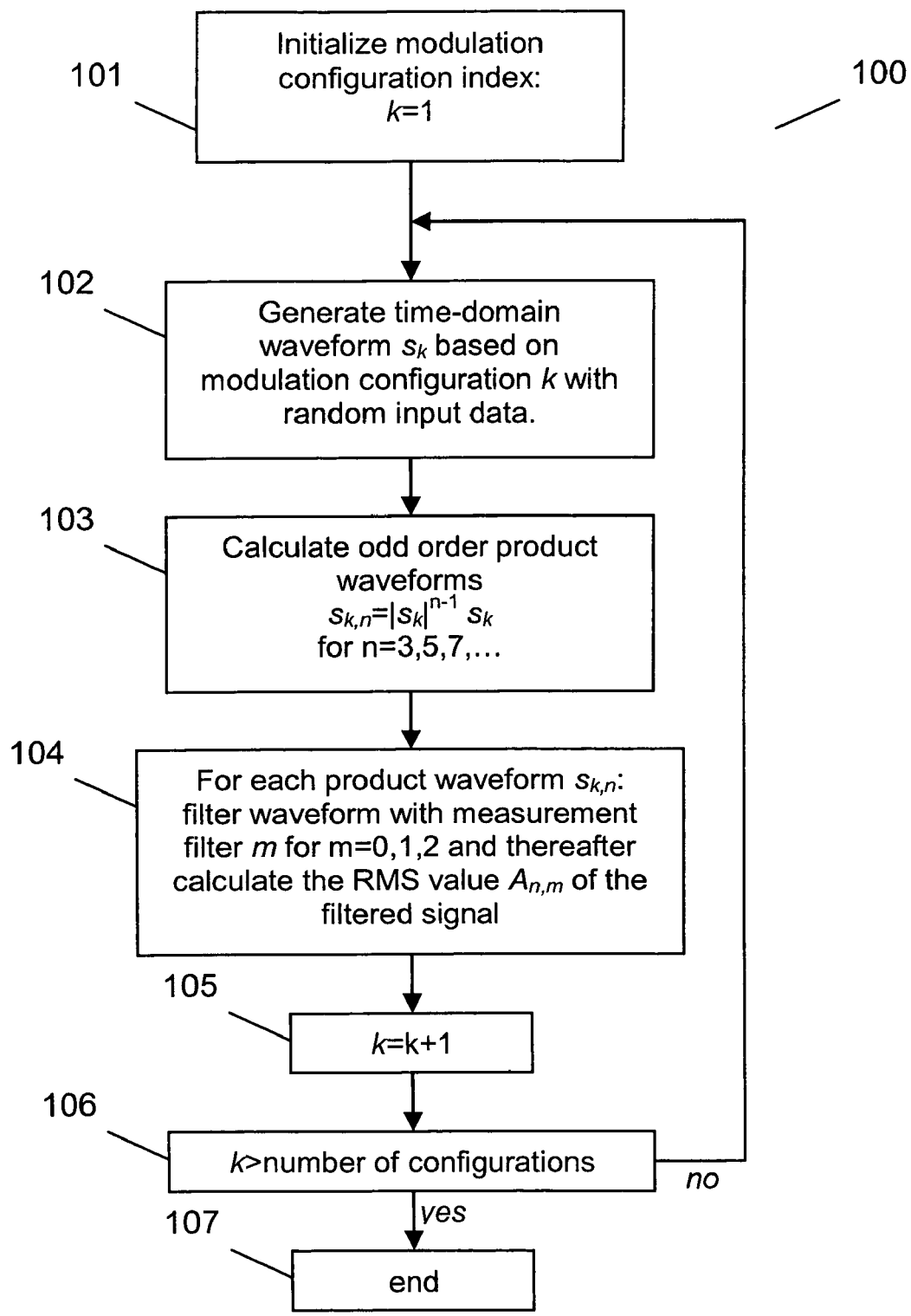
FIG. 3 shows a flowchart illustrating an example of how terms of modulation profiles can be generated for a number of modulation configurations.

A flowchart 100 summarizing an example of how the terms of these modulation profiles can be generated for a number of modulation configurations is shown in FIG. 3. First, in step 101, a modulation configuration index is initialized. For each configuration a waveform is generated in step 102 based on random input data with a length (e.g. in terms of number of symbols) that is sufficient to accurately estimate the spectra of an infinitely long waveform and its products. For the specific case of 3GPP it has been proven to be sufficient with $2^{15}=32\,768$ chips, corresponding to about an 8.5 ms long waveform, to obtain accuracy on the order of a few tenths of dB or less.

In step 103 the waveforms of the products for n=3, 5, 7, etc of the generated waveforms are calculated. Each of these waveforms is then filtered in step 104 with the measurement filters for the in-band channel and the two adjacent channels, i.e. for m=0, 1 and 2. Without loss of generality, the modulation profiles are typically calculated based on waveforms with unity RMS value (=1) and this condition is used throughout this document. In step 105 the index is updated, and if all modulation configurations have been covered (step 106), the generation of the terms is terminated in step 107. Otherwise, the calculation is continued in step 102 for the next modulation configuration.

For the example of FIG. 2 the calculated modulation profile, i.e. the set of terms described above, may be as follows, if the order is again limited to seven for the sake of clarity:

| | | |
|---|---|---|
| $A_{1,0} = 0.97$ | $A_{1,1} = 1.80 \times 10^{-3}$ | $A_{1,2} = 5.87 \times 10^{-4}$ |
| $A_{3,0} = 1.13$ | $A_{3,1} = 1.40 \times 10^{-1}$ | $A_{3,2} = 1.44 \times 10^{-3}$ |
| $A_{5,0} = 1.46$ | $A_{5,1} = 3.03 \times 10^{-1}$ | $A_{5,2} = 1.57 \times 10^{-2}$ |
| $A_{7,0} = 2.03$ | $A_{7,1} = 5.58 \times 10^{-1}$ | $A_{7,2} = 4.40 \times 10^{-2}$ |

For the specific use of back-off calculation as will be described here the modulation profile terms will be specified in the logarithmic (dB) domain, i.e.

$$P_{n,m} = 20 \cdot \log_{10}(A_{n,m})$$

The required back-off may then be calculated as:

$$BO_c = \sum_{n \in N, m \in M} a_{n,m} \cdot (P_{c,n,m} - P_{0,n,m})[dB],$$

where the subscript "c" denotes a specific modulation configuration. The required back-off is calculated relative to a reference modulation configuration denoted by $P_{0,n,m}$.

Thus if e.g. the order of the products is limited to n=3, 5, 7 and the measurement channels are limited to m=1, 2, the back-off is calculated as:

$$BO_c = a_{3,1} \cdot (P_{c,3,1} - P_{0,3,1}) + a_{5,1} \cdot (P_{c,5,1} - P_{0,5,1}) + a_{7,1} \cdot (P_{c,7,1} - P_{0,7,1}) + a_{3,2} \cdot (P_{c,3,2} - P_{0,3,2}) + a_{5,2} \cdot (P_{c,5,2} - P_{0,5,2}) + a_{7,2}(P_{c,7,2} - P_{0,7,2}).$$

The coefficients $a_{n,m}$ are unique for each transmitter configuration but independent on the modulation. These coefficients may be found by means of simulations and/or measurements where the required back-off is found to reach a certain ACLR. Here, only a limited set of configurations are used, e.g. 10-50 configurations carefully selected to have large difference in the modulation profiles. From these simulations and/or measurements the coefficients $a_{n,m}$ are determined using least-mean-squared fitting of the data.

As shown below, the back-off levels calculated in this way provide a much better equalization of the ACLR. The better accuracy also makes it easier to determine the coefficients $a_{n,m}$ from simulations and/or measurements for a limited number of modulation configurations.

The modulation configurations used for determining the coefficients $a_{n,m}$ can be randomly picked, in which case a fairly large amount (50) of test waveforms is usually needed. Such a selection is one brute force method to ensure a wide and representative set of waveforms for accurate back-off calculation. A large number of test configurations can also be motivated in real measurements that suffer from noise and limited accuracy.

Figure 4:
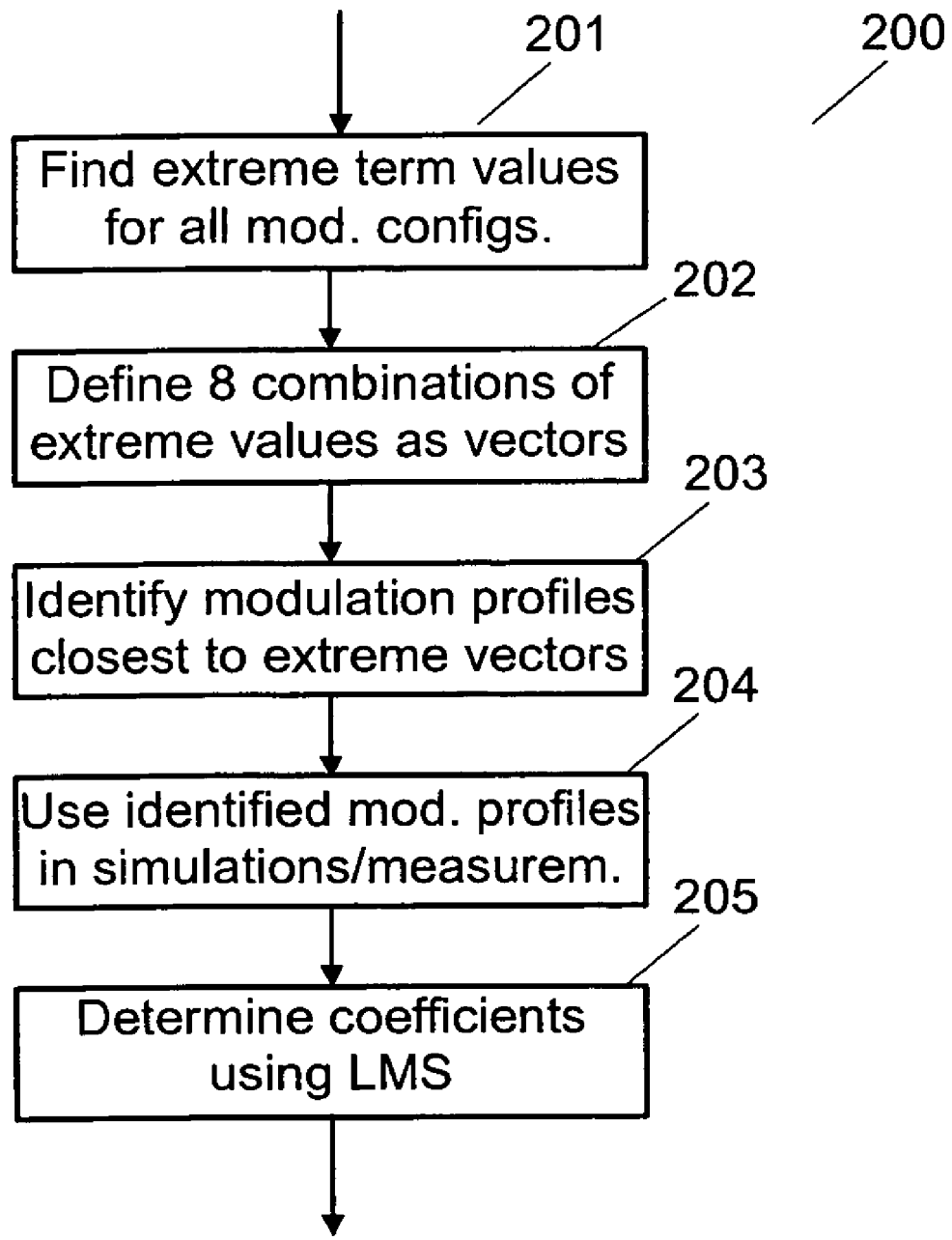
FIG. 4 shows a flowchart illustrating an example of calculating transmitter dependent coefficients.

However, it has been proven that only 9 test configurations can be sufficient, if noise and accuracy are not a problem. A good selection of modulation configurations can be defined based on modulation profile terms. In an example described below, it is shown that back-off calculation can be successfully carried out based on 3 terms only, namely $P_{3,1}$, $P_{5,1}$ and $P_{7,1}$. These three specific terms may also be used to identify an optimal selection of test configurations. The example is illustrated by the flowchart 200 in FIG. 4.

First, in step 201, the lowest and the highest value for each term among all modulation configurations in the HSUPA space should be found, i.e.

$$P3_{min} = \min_{k \in [1,N]} (P_{3,1,k}) \text{ and } P3_{max} = \max_{k \in [1,N]} (P_{3,1,k})$$

$$P5_{min} = \min_{k \in [1,N]} (P_{5,1,k}) \text{ and } P5_{max} = \max_{k \in [1,N]} (P_{5,1,k})$$

$$P7_{min} = \min_{k \in [1,N]} (P_{7,1,k}) \text{ and } P7_{max} = \max_{k \in [1,N]} (P_{7,1,k})$$

where k is the modulation configuration index and N is the number of modulation configurations. Eight (8) combinations of these extremes are then defined as vector in step 202

$$s_1 = [P3_{min} P5_{min} P7_{min}]$$

$$s_2 = [P3_{min} P5_{min} P7_{max}]$$

$$s_3 = [P3_{min} P5_{max} P7_{min}]$$

$$s_4 = [P3_{min} P5_{max} P7_{max}]$$

$$s_5 = [P3_{max} P5_{min} P7_{max}]$$

$$s_6 = [P3_{max} P5_{min} P7_{max}]$$

$$s_7 = [P3_{max} P5_{max} P7_{min}]$$

$$s_8 = [P3_{max} P5_{max} P7_{max}]$$

These vectors of terms are extremes that could be said to form the limits of a three-dimensional space and in that sense they are indeed well spread. These sets are hypothetical in that it cannot be guaranteed that there exist modulation configurations that resemble any of these sets. However, we may now traverse the modulation profiles for all modulation configurations and identify those who are the closest to each of these extremes. In other words, for each set $s_j$ the modulation configuration with a modulation profile vector $v_k = [P_{3,1,k}\ P_{5,1,k}\ P_{7,1,k}]$ that minimizes the vector difference magnitude $|s_j - v_k|$ is found (step 203).

The resulting 8 modulation configurations found will constitute an optimal set of test configurations. The ninth and last configuration is the standard RMC signal that serves as a reference for all back-off calculations. As mentioned, this optimal set of test configurations is then used in step 204 for simulations and/or measurements where the required back-off is found to reach a certain ACLR. From these simulations and/or measurements the coefficients $a_{n,m}$ are then determined in step 205 using least-mean-squared fitting of the data. If different operating conditions for a transmitter have to be considered, a separate set of coefficients is determined for each operating condition by repeating the flowchart 200 for each operating condition.

In the improved method for calculating the back-off, the sets over which the back-off is calculated (M and N) are usually quite limited. Firstly, ACLR1 (which is the ACLR for the first adjacent channel) is the primary parameter for 3GPP as ACLR2 (which is the ACLR for the second adjacent channel) requirements are usually fulfilled when ACLR1 is but not vice versa. Thus it can be argued that modulation profile terms with m=2 may be disregarded for this specific case. In practice when experimenting with the terms to use it has been found that the most important contribution to accurate back-off calculation is to include as many products as possible rather than as many different measurement channels as possible. Anyway, while increasing the number of terms improves accuracy it comes at the expense of increased cost/computational load as well as increased memory to hold the large number of terms. In other words the selection of terms to use is a trade off between accuracy and low cost.

Below, an example demonstrating the accuracy of the different formulas described above and how the fitting coefficients are determined is shown.

The example is based on one subset of modulation configurations within HSUPA space, all in all 93 000 configurations. The generated UL (uplink) WCDMA physical channels for this set are:
DPCCH, one code with spreading factor 256
DPDCH, one code with spreading factor 64
HS-DPCCH, one code with spreading factor 256
E-DPCCH, one code with spreading factor 256
E-DPDCH, one code with spreading factor 4.

For this set of physical channels all 93 000 combinations of gain factors according the 3GPP specifications are simulated.

The modulation profile as well as the CM and XM for each configuration were calculated based on a waveform generated according to the configuration with random input data and a length corresponding to 16384 chips with an oversampling rate OSR=16 and an RRC (root raised cosine) filter pulse with roll-off factor $\alpha$=0.22 truncated to a length of 32 chips. In this particular example only the modulation profile terms $P_{3,1}$, $P_{5,1}$ and $P_{7,1}$ were calculated for each modulation configuration. The extended order metrics XM were calculated for n=3, 5, 7.

From these 93 000 configurations 50 were randomly chosen and the corresponding waveforms were fed to a typical WCDMA PA by means of simulation. The back-off required to reach ACLR1=33 dB was found by iteration. In addition to the 50 configurations a 12.2 kbs RMC signal was generated to serve as a reference and the corresponding modulation profile as well as the XM and CM were calculated for this case $(P_{0,n,m}, CM_0, XM_{0,n})$.

The coefficients $a_{3,1}$, $a_{5,1}$, $a_{7,1}$, $b_3$, $b_5$, and $b_7$ were determined using regular least-mean-squared (LMS) fitting of the data based on the respective formula as discussed earlier.

Finally 20 000 randomly chosen configurations were simulated with a back-off estimated from the proposed formulas and the corresponding ACLR1 as obtained from the simulation was recorded. The spread of ACLR for each back-off estimation method is illustrated by means of histograms.

Figure 5:
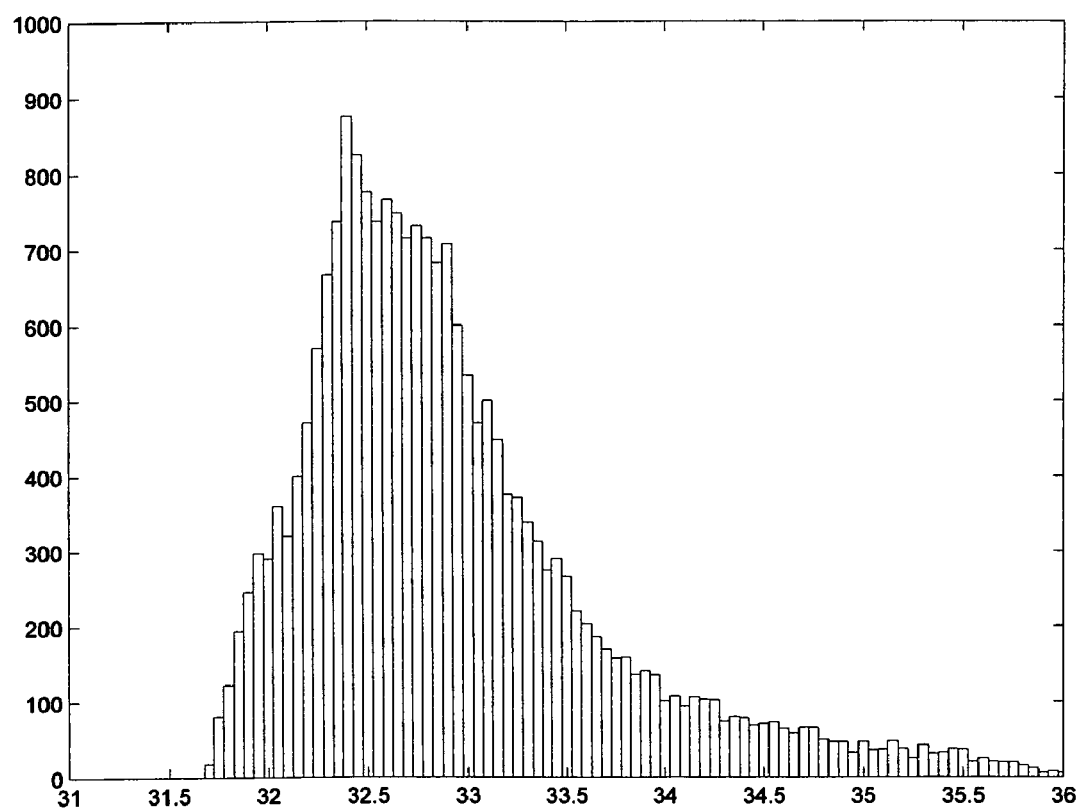
FIG. 5 shows a histogram illustrating ACLR spread for 20 000 randomly chosen modulation configurations when power reduction values have been estimated using cubic metrics.

A histogram for ACLR1 in 0.05 dB bins, where back-off values have been estimated using the cubic metric, is shown in FIG. 5. From this histogram it is seen that the spread of ACLR is considerable when the back-off is estimated using the cubic metrics only, which indicates that this method is insufficient. The specified ACLR is 33 dB.

Figure 6:
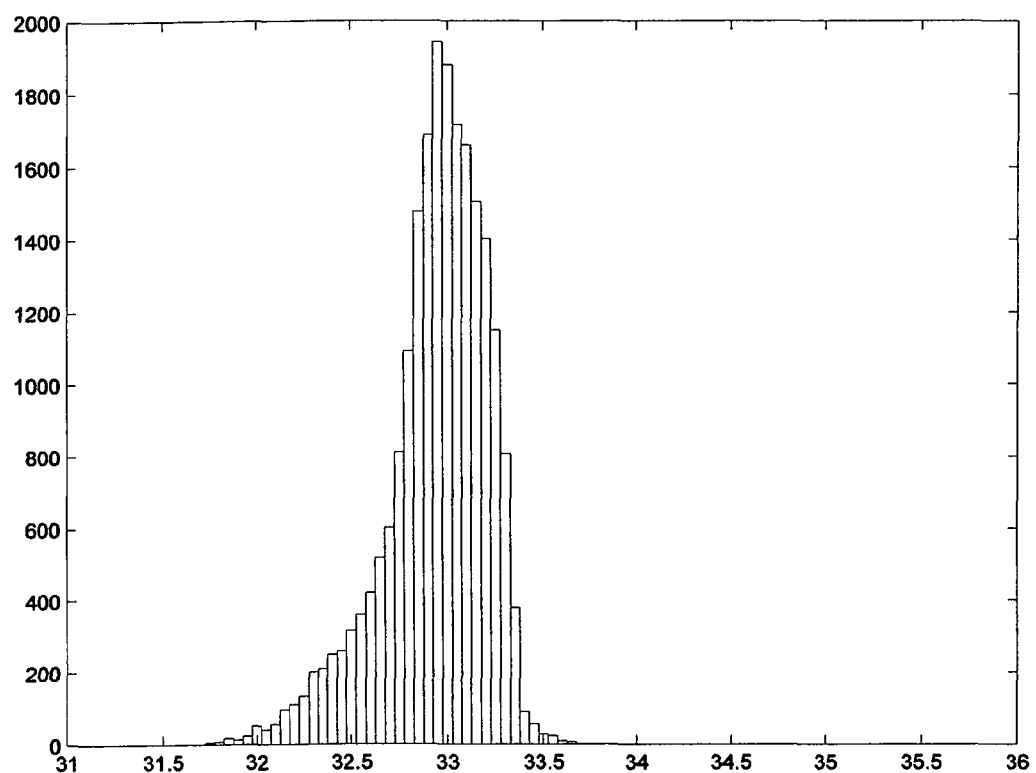
FIG. 6 shows a histogram illustrating ACLR spread for 20 000 randomly chosen modulation configurations when power reduction values have been estimated using extended order metrics.

A histogram for ACLR1 in 0.05 dB bins, where back-off values have been estimated using extended order metrics (XM), is shown in FIG. 6. It is seen that the spread of ACLR is reduced considerably compared to the cubic metric method.

Figure 7:
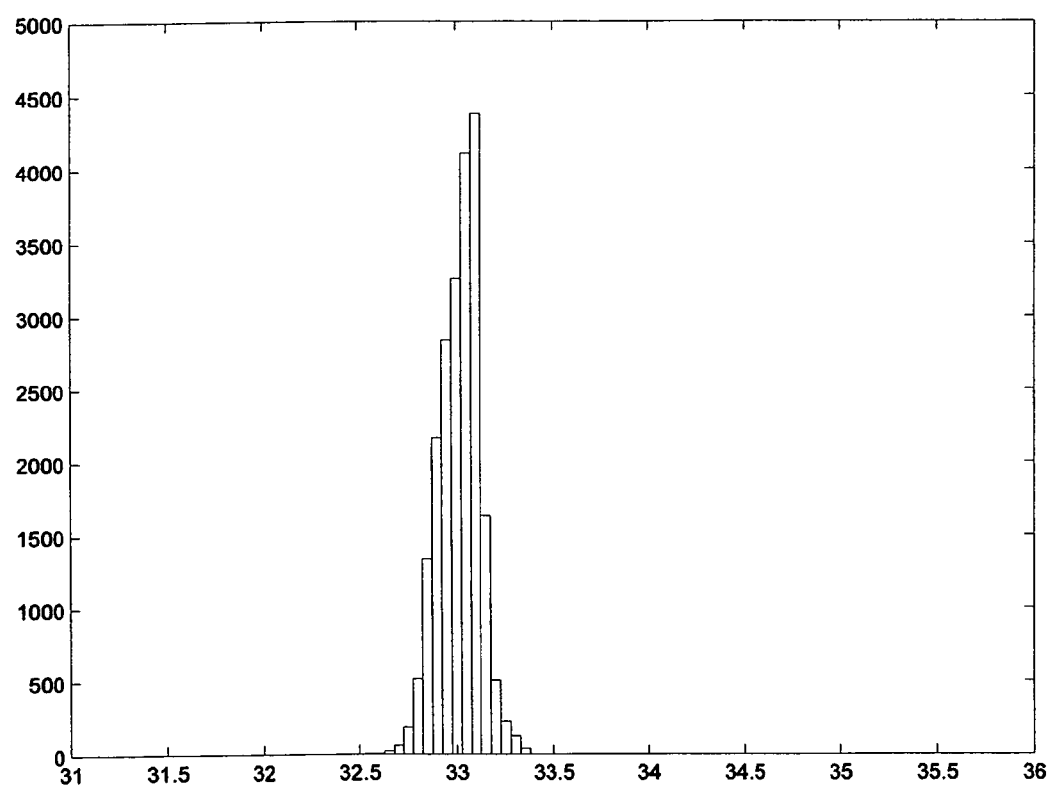
FIG. 7 shows a histogram illustrating ACLR spread for 20 000 randomly chosen modulation configurations when power reduction values have been estimated using modulation profiles.

A histogram for ACLR1 in 0.05 dB bins, where back-off values have been estimated using modulation profiles, is shown in FIG. 7. Here the spread of ACLR is further reduced, so that for all modulation configurations the resulting ACLR is within 0.5 dB of the specified value.

From the results above it is clear that the proposed modulation profile scheme provides unprecedented accuracy. The proposed extended order metrics delivers lower but still well-contained accuracy. The cubic metric previously proposed as the basis for standardization of back-off provides unacceptably poor accuracy.

When the method described above is implemented for use in a mobile terminal (user equipment), the following steps are involved:

The modulation is characterized by calculating modulation-specific data (i.e. products of different order or the terms of the modulation profiles described above) for the modulation configuration of interest (to be supported in the terminal). This is usually done only once because it is transmitter independent. Thus these data can be calculated in advance and stored in a memory in the terminal.

The transmitter is characterized by simulating and/or measuring a given transmitter configuration with a limited set of modulation configurations (e.g. up to 50 randomly picked or nine carefully selected as described above) to find the back-off required to reach a certain ACLR. These data are used to find transmitter-specific (and possibly operating-condition-specific) coefficients (e.g. the coefficients $a_{3,1}$, $a_{5,1}$, $a_{7,1}$ or $b_3$, $b_5$, and $b_7$ mentioned above) for a function that relates modulation data to back-off for this specific transmitter. When different operating conditions are to be considered, a set of coefficients is calculated for each condition. Also these data can be calculated in advance and stored in a memory in the terminal.

Figure 8:
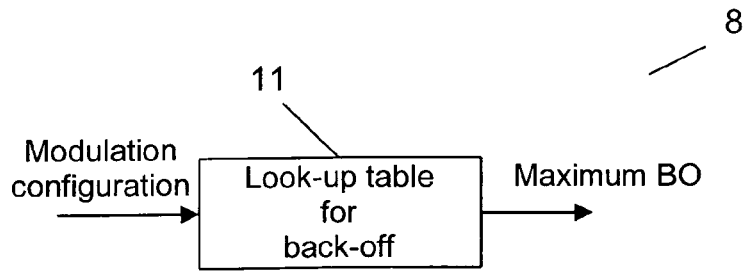
FIG. 8 shows a power reduction calculation unit implemented with one look-up table.

If the transmitter properties are assumed to be constant, i.e. different operating conditions are not considered, the maximum back-off for each configuration can be calculated using the methods described above. For this case the back-off calculation can be simply implemented using a static direct mapping function from modulation configuration to back-off. The mapping function in turn may for example be realized as a look-up table as shown in FIG. 8, which shows the Maximum Power Back-off Calculation unit 8 implemented with a look-up table 11. Thus instead of storing the modulation data and the transmitter coefficients in the mobile terminal, in this case the back-off values can be calculated in advance and stored in the look-up table 11. An alternative to the look-up table 11 is to derive a formula for the mapping function or use a combination of formulas and look-up tables.

Figure 9:
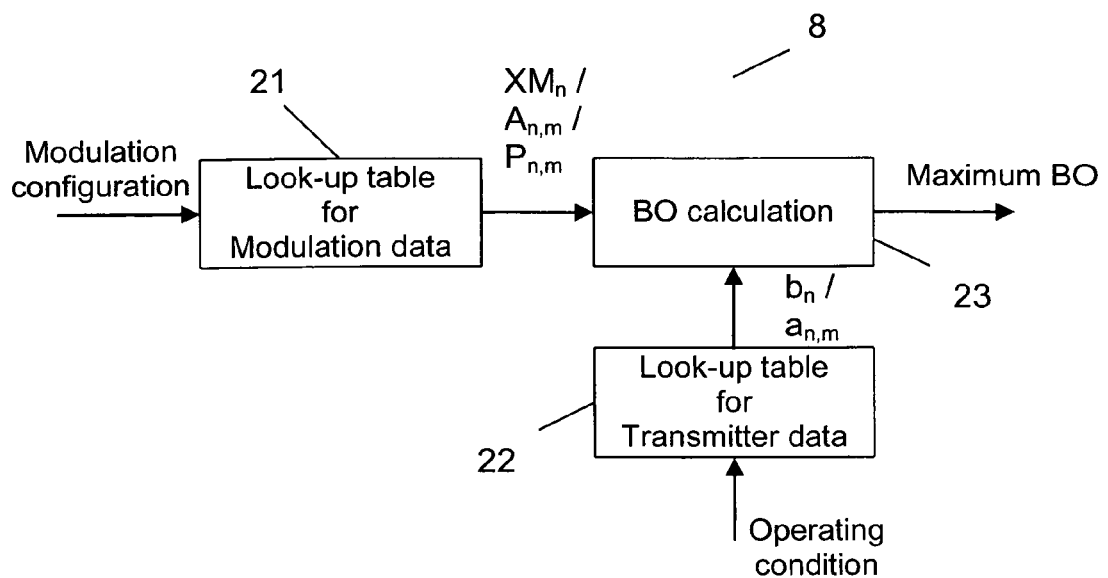
FIG. 9 shows a power reduction calculation unit implemented with two look-up tables and a calculation unit.

If the transmitter properties are variable, e.g. dependent on operating conditions like RF carrier frequency, temperature etc., the back-off cannot as easily be pre-calculated as described above, rather it may have to be calculated in the user equipment as a function of both modulation and transmitter properties as they are changed. In the Maximum Power Back-off Calculation unit 8 modulation properties are provided by a mapping function with modulation configuration as input. Transmitter properties are provided by another mapping function with parameters describing the operating condition as input. The mapping functions can be implemented as look-up tables 21 and 22 shown in FIG. 9, formulas or a combination of both. In the back-off calculation unit 23 the back-off value is then calculated from the outputs of the two look-up tables 21 and 22 using one of the formulas described above. The modulation property look-up table 21 will contain table entries for all modulation configurations supported and each entry will typically contain 2-4 numeric values describing the modulation-specific data (e.g. products of different order or the terms of the modulation profiles). The transmitter property look-up table 22 will typically contain a number of entries that are several orders of magnitude smaller than the modulation property table. Each set of transmitter-specific data is independent of modulation configuration and only contains some 2-4 values (e.g. the coefficients $a_{3,1}$, $a_{5,1}$, $a_{7,1}$ or $b_3$, $b_5$, and $b_7$ mentioned above).

Figure 10:
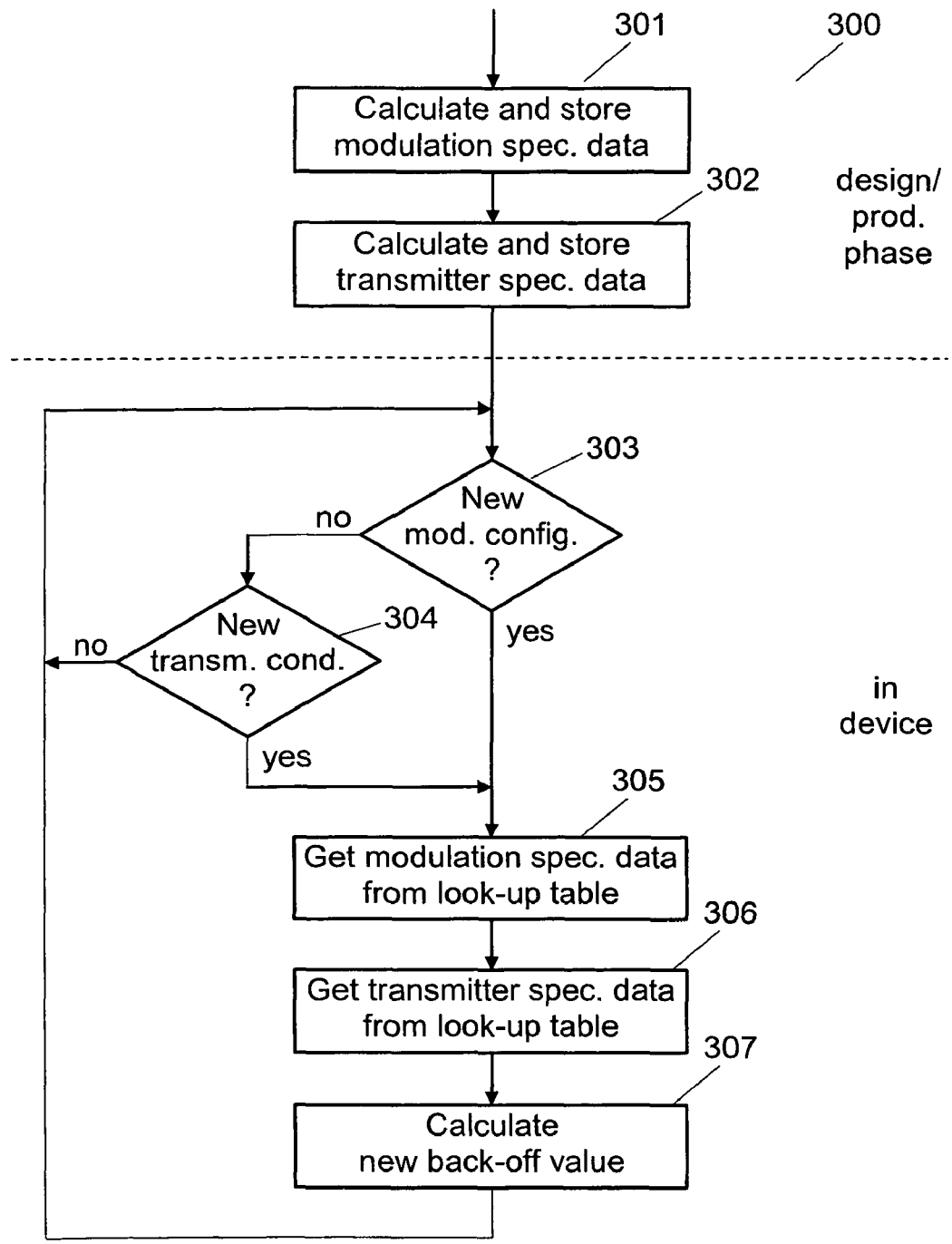
FIG. 10 shows a flowchart illustrating an example of calculation of power reduction in a mobile terminal.

FIG. 10 shows a flowchart 300 illustrating an example of how the method of calculating the required back-off for a transmitter can be implemented. In the example, steps 301 and 302 are performed during the design or production phase of the transmitter, while steps 303 to 306 are performed in the device each time a new back-off value has to be calculated during normal use of the device. This example corresponds to the implementation shown in FIG. 9. The example uses the modulation profile terms for calculating the back-off.

In step 301 the data characterizing the modulation configurations are calculated and stored in the look-up table 21. These calculations can be performed as shown in the flowchart 100 of FIG. 3. Similarly, in step 302 the data characterizing the transmitter and its operating conditions are calculated and stored in the look-up table 22. These calculations can be performed as shown in the flowchart 200 of FIG. 4. As mentioned, in this example these steps are performed in advance, e.g. on a computer, so that the look-up tables have the information stored when a new back-off value is to be calculated during use in dependence on the relevant modulation configuration and the current operating conditions.

The calculation of a new back-off value is performed in the back-off calculation unit 23. First, in steps 303 and 304 it is checked if a new calculation is needed. When this is the case, the modulation configuration is supplied to the look-up table 21 and the corresponding data, i.e. the modulation profile terms 4, or their logarithmic counterparts $P_{n,m}$ are provided to the back-off calculation unit 23 in step 305. Next, in step 306 parameters describing the operating condition of the transmitter are supplied to the look-up table 22 and the corresponding data, i.e. the coefficients $a_{n,m}$, are provided to the back-off calculation unit 23. Finally, in step 307 the back-off calculation unit 23 calculates the back-off value from the outputs of the two look-up tables 21 and 22 using one of the formulas described above.

As mentioned, the method may also be used at the design phase of a transmitter for verifying that the transmitter fulfils ACLR specifications. When modulation profiles are used and different operating conditions considered, the calculations can be performed as illustrated in the flowchart 400 shown in FIG. 11. This method is typically performed in a computer. First, in step 401, the terms $A_{n,m}$ are calculated for all configurations. These terms may have been calculated in advance as part of a huge database of such coefficients for all 300 000 cases. This calculation can be performed as shown in the flowchart 100 of FIG. 3.

Then an operating condition index is initialized in step 402, and for each operating condition the coefficients $a_{n,m}$ are calculated in step 403. These calculations can be performed as shown in the flowchart 200 of FIG. 4, in which the back-off is found by means of simulation and/or measurement for e.g. the nine modulation configurations mentioned earlier, and the terms for these configurations in combination with the actual back-off required to reach a certain ACLR make it possible to calculate the $a_{n,m}$ coefficients. Next the back-off values for this operating condition and all modulation configurations can be calculated and stored in step 404. In step 405 the operating condition index is updated, and if all operating conditions have not yet been covered (step 406), the calculation is continued in step 403 for the next operating condition. Otherwise, the calculations of back-off values are terminated.

The calculated and stored back-off levels may then be compared in step 407 with the back-off levels set out by the standard and/or the user's own back-off specifications. If any combination results in a back-off larger than allowed (step 408), the device tested does not comply with the specifications. Otherwise (step 409), the device fulfils the specifications.

Although various embodiments of the present invention have been described and shown, the invention is not restricted thereto, but may also be embodied in other ways within the scope of the subject-matter defined in the following claims.

What is claimed is:

1. A method of determining a level of power reduction for a transmitter arranged to transmit signals via a number of radio channels in a digital wireless communications system, each of said signals being modulated according to one of a number of modulation configurations, the method comprising the steps of:

providing data dependent on a property of a modulation configuration, said modulation dependent data comprising a at least one term calculated from a third order product of a signal modulated according to said modulation configuration;

calculating from said modulation dependent data an estimate for a power reduction to be used for transmission from said transmitter of signals modulated according to said modulation configuration;

providing the modulation dependent data so that said modulation dependent data in addition to said at least one term calculated from a third order product comprise at least one term calculated from a higher order product of the signal modulated according to said modulation configuration;

providing data dependent on a property for said transmitter; and calculating said estimate for a power reduction from said modulation dependent data and said transmitter dependent data.

2. The method according to claim 1, wherein said at least one calculated terms are calculated from an RMS value of each of the third and higher order products.

3. The method according to claim 2, wherein said at least one calculated terms are calculated from an RMS value of each of the third and higher order products within at least one measurement channel (H0(f); H1(f); H2(f)).

4. The method according to claim 3, wherein said terms are calculated by the steps of:

generating for each modulation configuration a waveform based on random input data;

calculating for each generated waveform waveforms of third and higher order products of the generated waveform;

filtering the calculated waveforms with measurement filters ($H_1(f)$; $H_2(f)$) for at least one adjacent channel; and calculating RMS values of the filtered waveforms.

5. The method according to claim 1, wherein said at least one terms are calculated from third, fifth and seventh order products.

6. The method according to claim 1, wherein said transmitter dependent data comprise a number of coefficients determined from at least one of simulations and measurements for a limited set of modulation configurations using least-mean square fitting.

7. The method according to claim 6, wherein said coefficients are determined by the steps of:

finding the lowest and the highest value for each of a number of said terms calculated from the third and higher order products;

defining the eight combinations of these lowest and highest values as vectors;

identifying modulation configurations having terms closest to each of said defined vectors; and using the terms of the identified modulation configurations in said at least one of simulations and measurements.

8. The method according to claim 6, wherein the coefficients are determined for different operating conditions for said transmitter.

9. The method according to claim 1, wherein the step of calculating a power reduction estimate is performed in a mobile terminal comprising said transmitter.

10. The method according to claim 1, wherein the step of calculating a power reduction estimate is performed during a design phase of said transmitter.

11. A mobile terminal, comprising:

a transmitter configured to transmit signals via a number of radio channels in a digital wireless communications system, each of said signals being modulated according to one of a number of modulation configurations; and a processing circuit configured to provide an estimate for a power reduction to be used for transmission from said transmitter of signals modulated according to said modulation configuration, wherein the processing circuit is configured to calculate the estimate from data dependent on a property of a modulation configuration, said modulation dependent data including at least one term calculated from a third order product of a signal modulated according to said modulation configuration;

wherein said modulation dependent data in addition to said at least one term calculated from a third order product, also include at least one term calculated from a higher order product of a signal modulated according to said modulation configuration; and wherein said estimate is calculated by the processing circuit from said modulation-dependent data and data that are dependent on a property of the transmitter.

12. The mobile terminal according to claim 11, wherein said at least one terms calculated from the products are calculated from an RMS value of each of the third and higher order products.

13. The mobile terminal according to claim 12, wherein said terms are calculated from an RMS value of each of the third and higher order products within at least one measurement channel ($H_o(f)$; $H_1(f)$; $H_2(f)$).

14. The mobile terminal according to claim 11, wherein said terms calculated from the products are calculated from third, fifth and seventh order products.

15. The mobile terminal according to claim 11, wherein said transmitter-dependent data comprise a number of coefficients determined from at least one of simulations and measurements for a limited set of modulation configurations using least mean-square fitting.

16. The mobile terminal according to claim 15, wherein the coefficients are determined for different operating conditions for said transmitter.

17. The mobile terminal according to claim 11, wherein the processing circuit includes a look-up table in which power reduction estimates calculated in advance for each modulation configuration are stored.

18. The mobile terminal according to claim 11, wherein the processing circuit is also configured to:

provide the modulation-dependent data, the modulation-dependent data comprising terms calculated from a third order product and at least one higher order product of a signal modulated according to said modulation configuration;

provide the data that are dependent on a property of the transmitter; and calculate from said modulation dependent data and the data that are dependent on a property of the transmitter, the estimate for a power reduction to be used for transmission from said transmitter of signals modulated according to said modulation configuration.

19. The mobile terminal according to claim 18, wherein the processing circuit is configured to:

provide the modulation-dependent data utilizing a first look-up table in which terms calculated in advance for each modulation configuration are stored; and provide the data that are dependent on a property of the transmitter utilizing a second look-up table in which data calculated in advance for the transmitter are stored.

* * * * *

UNITED STATES PATENT AND TRADEMARK OFFICE
CERTIFICATE OF CORRECTION

| | | |
|---|---|---|
| PATENT NO. | : 8,279,971 B2 | Page 1 of 1 |
| APPLICATION NO. | : 12/521056 | |
| DATED | : October 2, 2012 | |
| INVENTOR(S) | : Sundstrom et al. | |

It is certified that error appears in the above-identified patent and that said Letters Patent is hereby corrected as shown below:

On the Title Page, in Item (57), under "ABSTRACT", in Column 2, Line 9, delete "there from." and insert -- therefrom. --, therefor.

Figure 11:
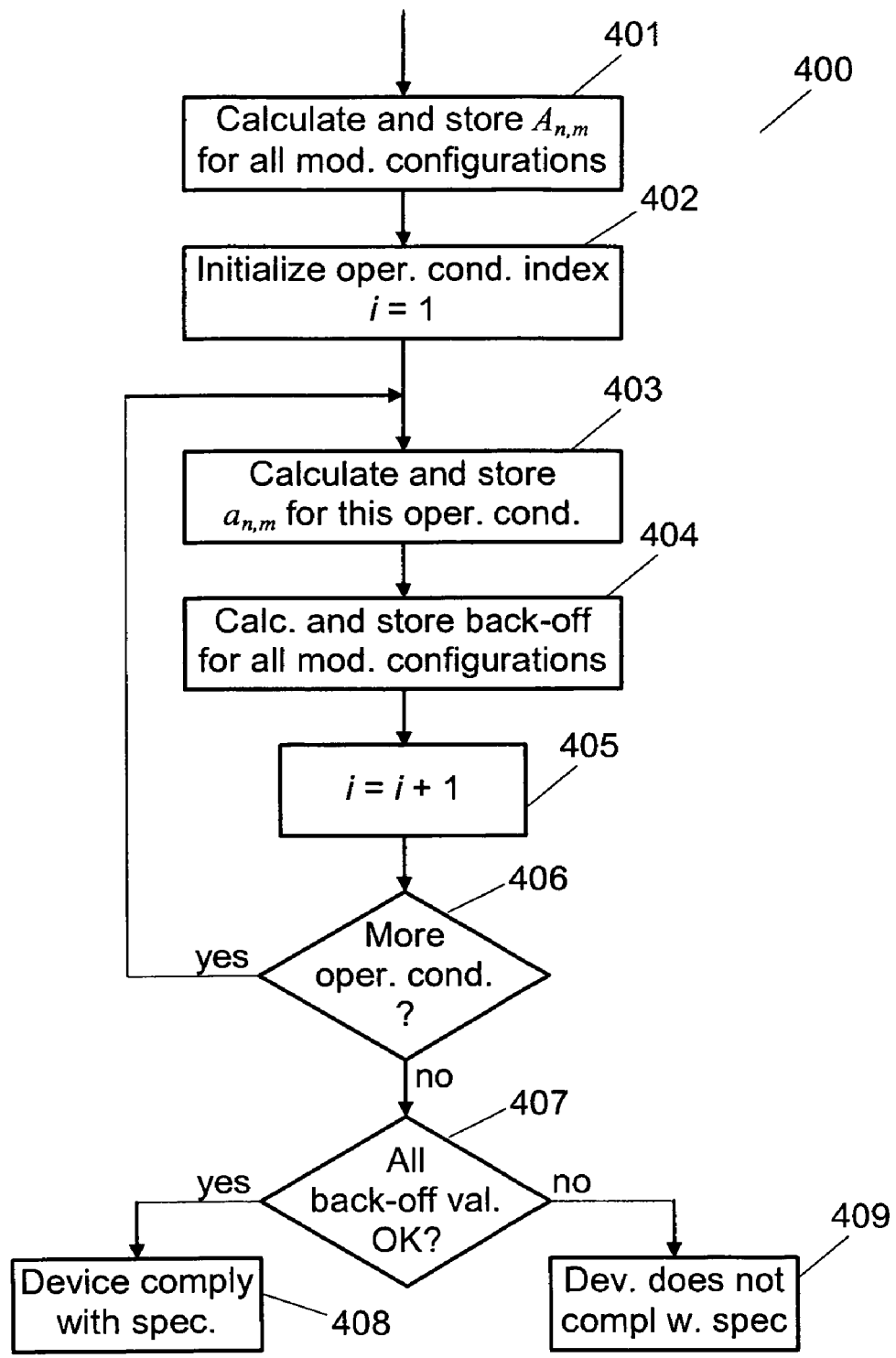
FIG. 11 shows a flowchart illustrating an example of calculation of power reduction during the design phase of a mobile terminal.

In Fig. 11, Drawing Sheet 10 of 10, for Tag "409", in Line 2, delete "compl w. spec" and insert -- compl. w. spec. --, therefor.

In Column 8, Line 30, delete "(rms( | $s_1$ |$^7$))," and insert -- (rms( | $s_1$ |$^7$)), etc. --, therefor.

In Column 9, Line 36, delete "$A_{n,m}$" and insert -- $A_{n,m}$, --, therefor.

In Column 14, Line 2, delete "$a_{31}$, $a_{51}$, $a_{71}$" and insert -- $a_{3,1}$, $a_{5,1}$, $a_{7,1}$ --, therefor.

In Column 14, Line 30, delete "4," and insert -- $A_{n,m}$ --, therefor.

In Column 14, Line 30, delete "$P_{n,m}$" and insert -- $P_{n,m}$, --, therefor.

In Column 15, Line 21, in Claim 1, delete "a at least" and insert -- at least --, therefor.

In Column 15, Line 47, in Claim 3, delete "(H0(f); H1(f); H2(f))." and insert -- ($H_0(f)$; $H_1(f)$; $H_2(f)$). --, therefor.

In Column 16, Line 50, in Claim 13, delete "$H_o(f)$;" and insert -- $H_0(f)$; --, therefor.

Signed and Sealed this
Fifth Day of February, 2013

Teresa Stanek Rea
*Acting Director of the United States Patent and Trademark Office*